Figure 1:
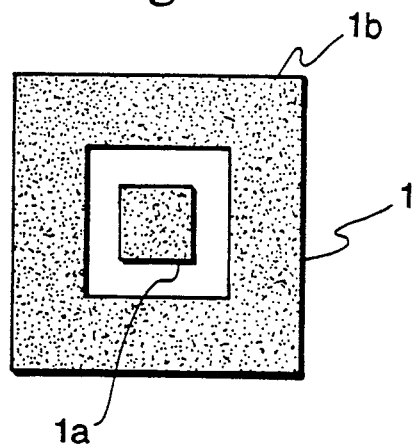

United States Patent [19]

Edwards

[11] Patent Number: 5,063,306
[45] Date of Patent: Nov. 5, 1991

[54] PROXIMITY SENSING DEVICE

[75] Inventor: Jeffery D. Edwards, Como, Australia

[73] Assignee: Intellect Electronics Ltd., Australia

[21] Appl. No.: 525,294

[22] PCT Filed: Feb. 20, 1986

[86] PCT No.: PCT/AU86/00043
   § 371 Date: Sep. 24, 1987
   § 102(e) Date: Sep. 24, 1987

[87] PCT Pub. No.: WO87/04851
   PCT Pub. Date: Aug. 13, 1987

Related U.S. Application Data

[63] Continuation of Ser. No. 131,194, Sep. 24, 1987, abandoned.

[30] Foreign Application Priority Data

Jan. 30, 1986 [AU] Australia ............... PH04377

[51] Int. Cl.[5] ............... H03K 00/00; G06G 7/12; G01N 27/00
[52] U.S. Cl. ............... 307/308; 307/494; 328/5
[58] Field of Search ............... 307/308, 580, 494; 328/1, 5; 331/65; 361/278

[56] References Cited

U.S. PATENT DOCUMENTS

| | | | |
|---|---|---|---|
| 3,909,625 | 9/1975 | Colglazier et al. | 328/5 |
| 3,944,843 | 3/1976 | Vaz Martins | 328/5 |
| 4,053,849 | 10/1977 | Bower et al. | 331/65 |
| 4,295,132 | 10/1981 | Burney et al. | 328/5 |
| 4,345,167 | 8/1982 | Calvin | 307/308 |
| 4,380,040 | 4/1983 | Posset | 361/278 |
| 4,663,542 | 5/1987 | Buck et al. | 307/308 |

FOREIGN PATENT DOCUMENTS

| | | |
|---|---|---|
| 1361049 | 7/1974 | European Pat. Off. . |
| 2739786 | 3/1979 | Fed. Rep. of Germany . |
| 2311249 | 3/1980 | Fed. Rep. of Germany .......... 328/5 |
| 3242621 | 5/1984 | Fed. Rep. of Germany . |
| 2271538 | 12/1975 | France . |
| 2115553 | 9/1983 | United Kingdom . |

OTHER PUBLICATIONS

West, "Logarithmic Humidity Sensor Amplifier", IBM Technical Disclosure Bulletin, vol. 27, No. 8, Jan. 1985.

*Primary Examiner*—Stanley D. Miller
*Assistant Examiner*—Trong Phan
*Attorney, Agent, or Firm*—Dorsey & Whitney

[57] ABSTRACT

A proximity sensing device comprising a sensor including a planar capacitor (1) having a central region (1a) and an outer region (1b) separated by a dielectric area, differentiator means (2,3) associated with said capacitor to form a spiked output pulse from a drive input pulse having at least one stepped edge and comparitor means (10) to repeatedly compare said spiked output pulses with a reference datum indicative of no proximity body being located adjacent to or touching said sensor to determine if such a proximity body is so located. The ratio of the perimeters of the central region and dielectric area of the planar capacitor is approximately 2:1 and its capacitance is comparable to that of a human finger.

10 Claims, 3 Drawing Sheets

PROXIMITY SENSING DEVICE

This is a continuation of Ser. No. 131,194 filed Sep. 24, 1987 and now abandoned.

The present invention relates to proximity sensing devices, and in particular capacitive sensing devices.

Prior art devices used to detect the proximity of a person or object, have as their principle of operation, the utilization of a change in capacitance of the sensing component altering the frequency of an oscillator, and the detection of this change in frequency as indicative of the presence of a person or object.

Such frequency dependent devices have had limited application particularly in situations where compact size is required and where environmental influences and objects, not being the desired subjects for detection, interfere with the frequency detection and generate undesired and spurious results.

This is found to be the case for capacitive sensing devices such as switches or keys that have been used in keyboards and the like where there is a plastic or glass overlay. The presence of the overlay, tinting, moisture, dust, and finger grease have been known to affect the frequency of oscillation resulting in inaccurate detection.

In an effort to try and overcome the aforementioned disadvantages, the present invention provides a specially adapted capacitive sensor and the detection of a change in a differentiated signal caused by the proximity of a person, (or other capacitive object), and particularly, the accurate detection of a persons finger through glass or plastic on a capacitive sensor according to the invention.

In the case of a keyboard, where a number of sensors are required, the present invention further provides a method of scanning the sensors for the differentiated signal and any change thereto, which minimises interference from the scanning circuitry.

It has been found that the detection of a differentiated signal and any changes thereto rather than detection of a frequency change, provided advantages in that such previous environmental disturbances from cover plates, dust moisture etc., have a minimal or no effect upon the differentiated signal.

The specially adapted capacitive sensor comprises, a planar capacitor having an outside area and a central plate. The planar capacitor is preferably etched directly on a printed circuit board, and this contributes to the space and cost savings of the device.

It has been found that the size of the central plate affects the required dielectric distance between the outside area and central plate for the proper functioning of the capacitor as part of the proximity device. For a one finger size central plate a ratio of ⅓ between the central plate size and the dielectric distance is preferable. For a two finger size central plate, a ratio of ⅔ is preferably.

The layout of the planar capacitor can also be determined alternatively, and preferably, by the ratio between the outer perimeter of the dielectric between the outer area and central plate, and the perimeter of the central plate. A preferable ratio of about 2.1 has been determined for proper functioning.

Preferably connected to the back of the central plate of the planar capacitor, are a transistor, preferably bipolar, and a bias resistor for the transistor in a configuration such that the circuit behaves as an electronic differentiator of the drive signal. The connection to the back of the central plate allows a user's finger to approach the sensor without obstruction, and also the configuration is preferred as it minimises electrical interference whilst being as close as possible to the plate for a usable amount of signal. The gain is set for maximum output without introducing finger noise. (It has been found that finger poise manifests itself as a 50 hertz oscillation).

The drive signal, generated externally, is applied preferably to the outside area of a planar capacitor, and picked up by the central plate. The drive signal needs to be a pulse with a sharp leading edge and preferably is a square wave pulse. It has been found that a CMOS driver circuit provides a suitable quality pulse.

As the circuit is behaving as an electronic differentiator, the square wave input results in a corresponding output of a sharp spike, at the collector of the transistor.

The detection of a change in the amplitude of the spike is the means by which the presence of a user is determined.

The presence of a user's finger through glass or plastic over a planar capacitor interferes with the pickup of the drive pulse by the central plate. It is considered that the finger acts as a third plate for the capacitor, absorbing some of the drive pulse and thereby reducing the amplitude of the spikes coming from the transistor output. A finger on glass or plastic should preferably have a capacitance comparable to the capacitance of the planar capacitor and it has been found that where the value of capacitance is about the same a change of approximately 25% in the amplitude of the spike is observed.

The detection of the change in the differentiated signal (spike signal) is done by comparison of the differentiated signal, preferably after amplification, with a reference signal in a comparator circuit.

The comparator circuit is part of a spike processing circuit which comprises, in general an operational amplifier/filter circuit connected to a microprocessor. The microprocessor generates the square wave drive pulse and controls the delivery of such pulses to the planar capacitor sensor.

The comparator reference signal is initially obtained from the first square wave pulse differentiation when there is no finger present on the sensor.

The reference is constantly being monitored and re-established by the microprocessor. Logic in the microprocessor reads and checks the differentiated peak level to decide that it is within the expected range.

The spike processing circuitry serves the further purposes of amplifying the spikes and filtering out background noise.

In a keyboard configuration, comprising a number of capacitative proximity sensors, a multiplexer controlled by the microprocessor is provided to switch to each sensor in turn and thereby scan the whole keyboard matrix.

As the d.c. level of each transistor is slightly different (due to manufacturing characteristics and resistor biasing), when each transistor level is switched through the multiplexer, a series of edges are produced which generate spikes that can swamp the spikes that need to be detected.

To overcome this, a window is provided by the spike processing circuitry under microprocessor control.

The window is a logical signal such as from a buffer or latch chip, driven by the microprocessor, which prevents the receipt of signal from a sensor until the multiplexer has switched to that sensor. In this way, the undesired spikes associated with switching are not processed.

In a preferred mode of operation, the drive pulse is not activated until after switching has occured and the window is opened. The whole process has been found to take a period of approximately 50 micro seconds per key which is amply sufficient for detection.

The microprocessor performs the further function of key character or character string output and key debouncing which is the filtering out of unwanted threshold oscillations associated with the approach of a finger to a sensor key.

From the above, it can be seen that a keyboard (planar capacitor sensors, differentiators, and multiplexer) and a microprocessor and support circuitry (spike processing circuitry comprising amplifiers/filters) are necessary for the operation of the proximity device as a keyboard in applications such as a consumer access keyboard.

Conveniently the keyboard can be a separate part of the remaining device, being joined by a cable to the microprocessor circuitry and thereby increase the possible applications of the device.

One preferred embodiment of the invention will be further described with reference to the figure as follows:

FIG. 1 layout sketch of a printed planar capacitor (shaded areas are copper on a printed circuit board).

Figure 2:
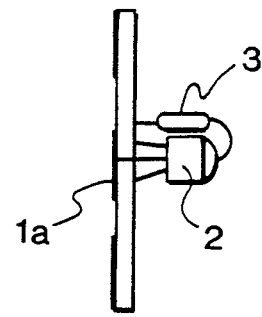

FIG. 2 side view of a differentiator sensor comprising a planar capacitor, bipolar transistor and resistor.

Figure 3A:
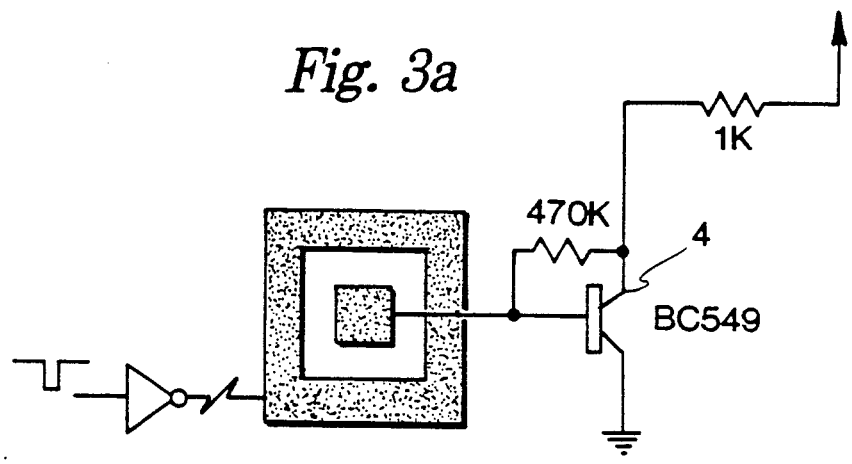

FIG. 3a single sensor circuit (the transistor and resistor of the differentator of FIG. 2 are shown externally for clarity).

Figure 3B:
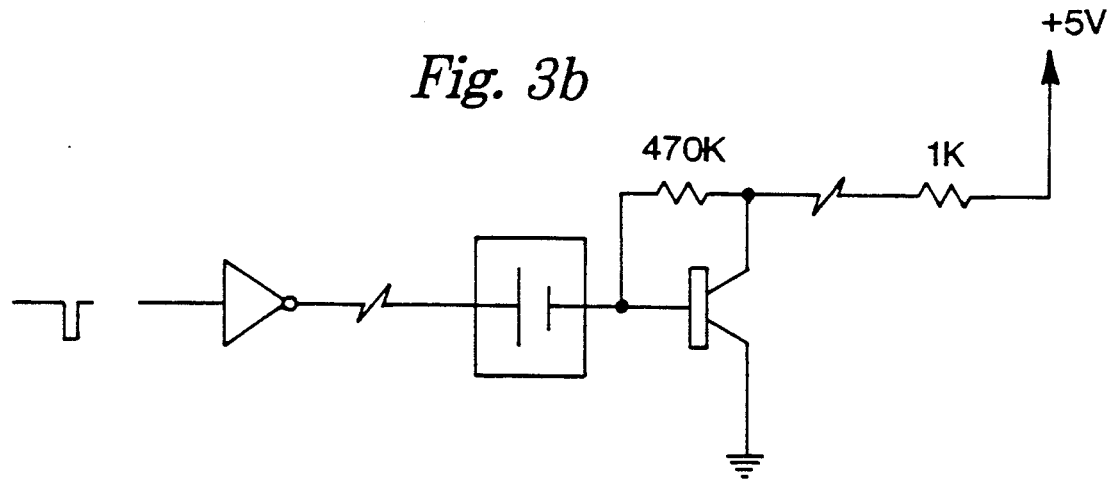

FIG. 3b equivalent circuit for the circuit of FIG. 3a.

Figure 4:
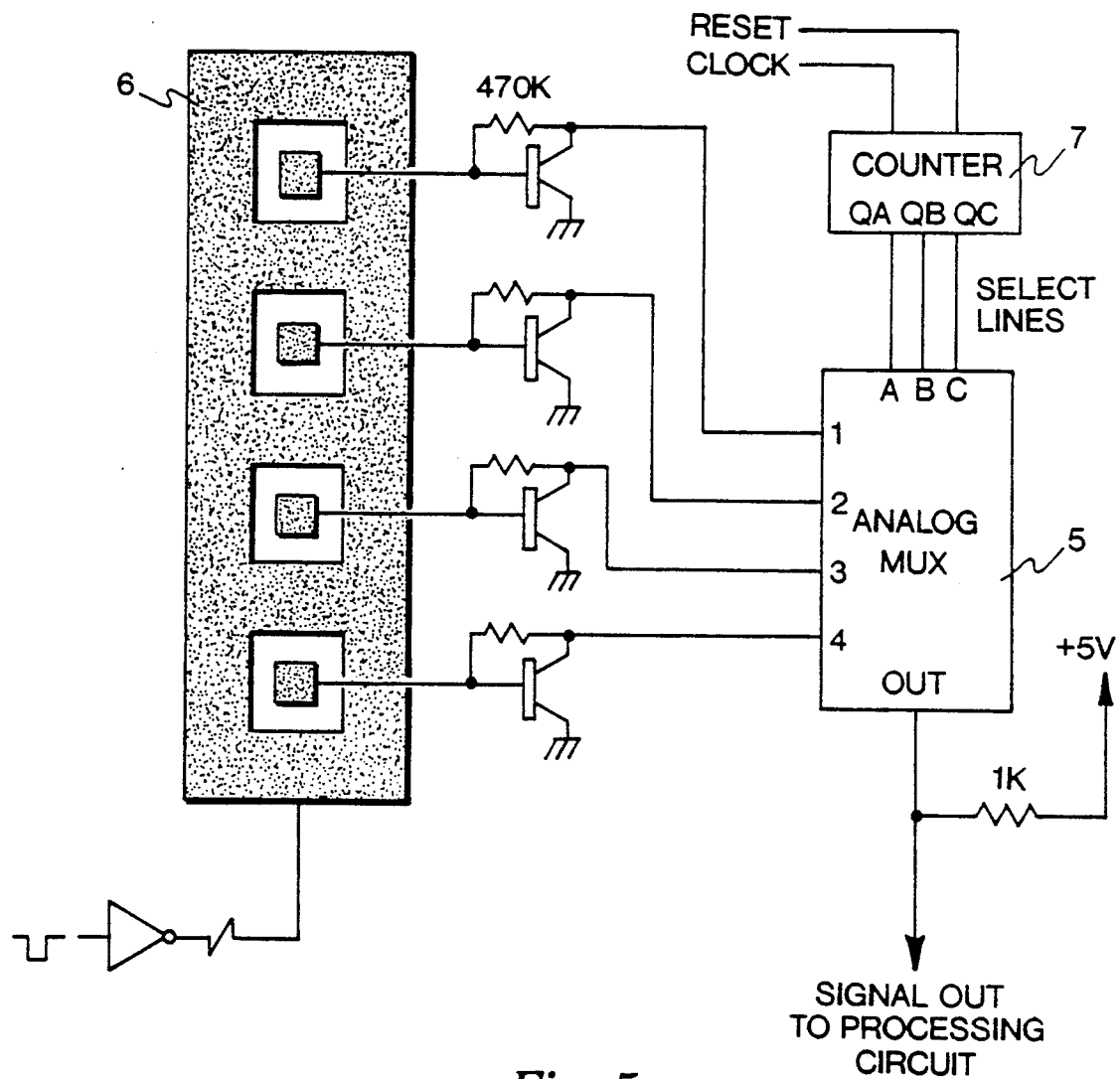

FIG. 4 keyboard sensor circuit (4 sensors) showing connection to multiplexer circuitry.

Figure 5:
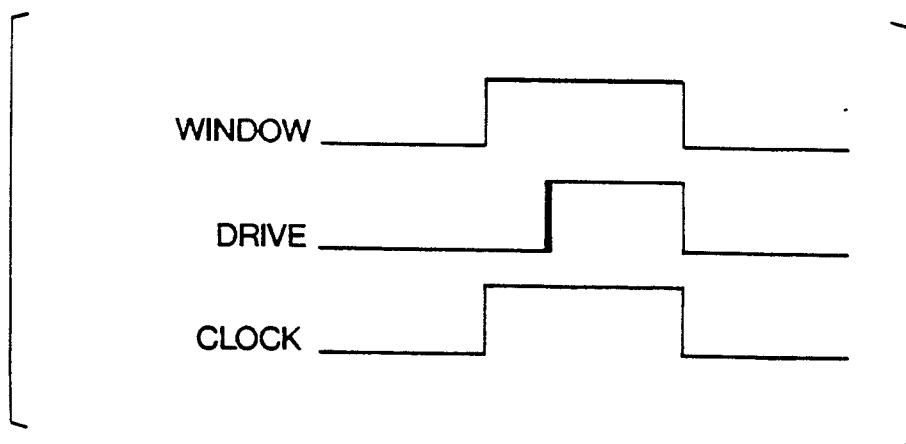

FIG. 5 graphical representation of the square wave pulse in relation to the time sequence of the window and clock, (all produced by microprocessor)

Figure 6:
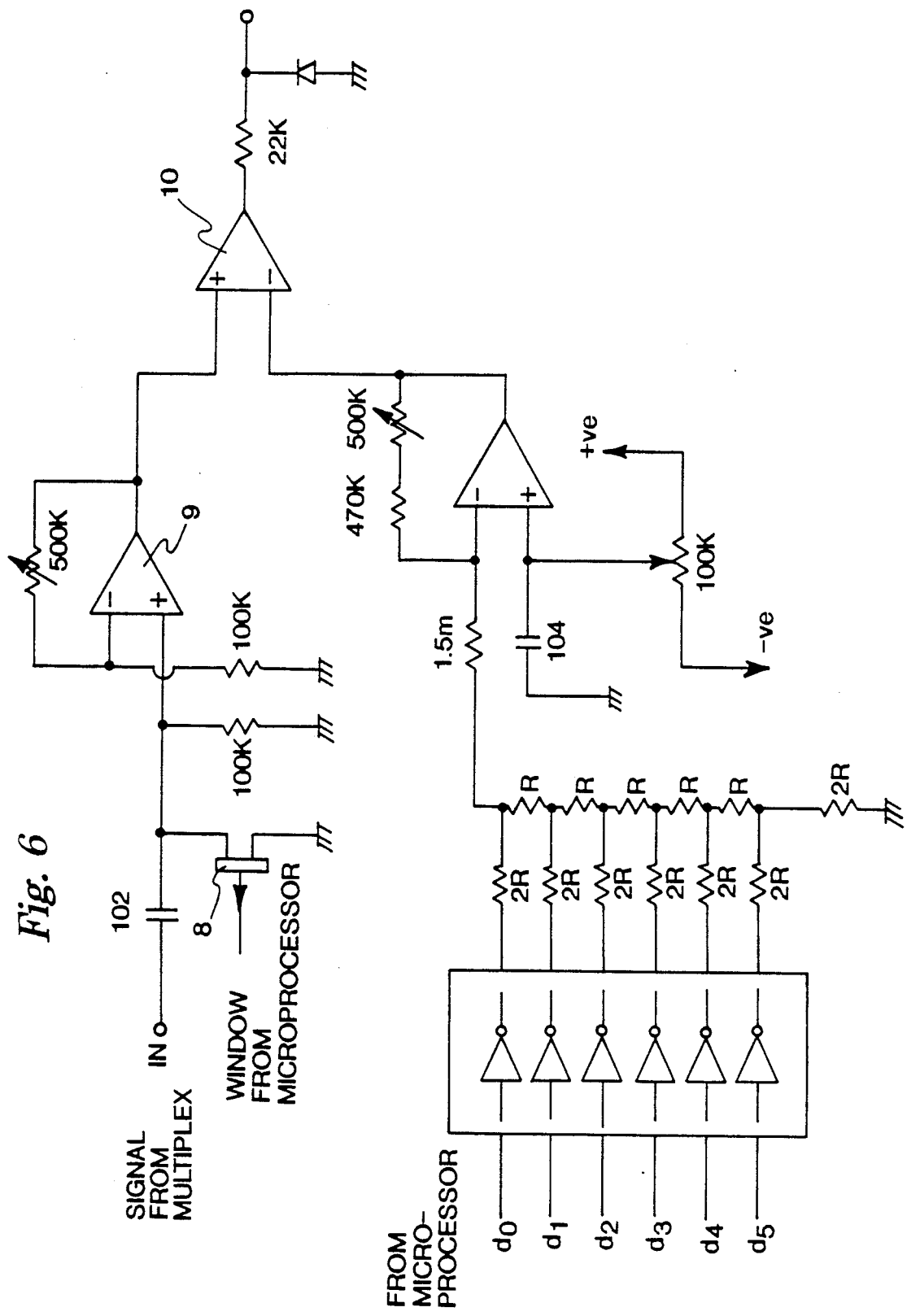

FIG. 6 spike processing circuitry.

Referring to FIGS. 1, 2, 3a and 3b, a planar capacitor 1 etched on a printed circuit board, has a bipolar transistor 2 and a bias resistor 3 connected from behind to the central plate 1a.

A square wave pulse received at the outside area 1b is picked up by the central plate and differentiated by the circuit to produce a spike signal output at the collector of the transistor 4.

Referring to FIG. 4, an analog multiplexer 5, is shown connected to a keyboard array 6 consisting of 4 sensors. The multiplexer is controlled by a microprocessor (not shown) to switch to each key and thereby scan the keyboard continuously. A counter 7 driven by a clock pulse from a microprocessor (not shown) is used to regulate the scan. The microprocessor is also used for key character output and key debouncing as described earlier.

Referring next to FIGS. 4, 5 and 6, a square wave drive signal is transmitted to a planar capacitor sensor from the microprocessor, only after the multiplexer has switched to that particular sensor. The spike processing circuit shown in FIG. 6 performs its function under software control from the microprocessor.

The microprocessor software opens a window 8, which is a buffer or latch chip, which allows signal to pass into the processing circuitry.

The graphical representation of this process is shown in FIG. 5, and the leading edge of the drive pulse (emphasized for clarity in FIG. 5) provides the detected spike signal.

The spike signal is further amplified by the amplifier 9 in the top branch of the FIG. 6 circuit as shown, and is compared with a reference signal from the lower branch of the circuit at the junction 10 where an operational amplifier acts as the comparator. The lower branch of the circuit FIG. 6 develops the reference signal from the microprocessor which utilizes the signal on switching on of the device as previously described.

I claim:

1. A proximity sensing device comprising:
   a sensor including a planar capacitor having a central region and an outer region, the capacitance value of said planar capacitor being substantially unaffected by the presence of a proximity body adjacent to said sensor;
   means for forming a spiked output in response to a drive input pulse having at least one stepped edge, said planar capacitor forming part of said means for forming a spiked output pulse;
   amplitude comparator means in circuit connection with said means for forming a spiked output pulse for receiving said spiked output pulse and repeatedly comparing the amplitude of said spiked output pulse with a reference datum, the amplitude of said spiked output pulse being influenced by said proximity body located adjacent said sensor, said amplitude comparator means providing a proximity sensing output signal when the amplitude of said spiked output pulse is reduced as compared with said reference datum, said proximity sensing output signal thereby providing an indication of whether said proximity body is located adjacent said sensor.

2. The proximity sensing device as claimed in claim 1 wherein said amplitude comparator means is comprised of an amplifier and a means for filtering background noise in circuit connection with a microprocessor.

3. The proximity sensing device as claimed in claim 1, wherein said planar capacitor is etched onto a printed circuit board.

4. The proximity sensing device as claimed in claim 1, wherein said means for forming a spiked output pulse includes a transistor said a resistor biasing said transistor in circuit connection with one region of said planar capacitor.

5. The proximity sensing device as claimed in claim 4, wherein said transistor and said resistor are mounted on the back of a printed circuit board, the front side of said printed circuit board having said planar capacitor etched thereon.

6. The proximity sensing device as claimed in claim 1 wherein the size of said central region of said planar capacitor determines a dielectric area between said central region and said outer region that determines the capacitance value of said planar capacitor and the capacitance value of said planar capacitor is similar to that of a human finger on glass or plastic.

7. The proximity sensing device as claimed in claim 6, wherein the ratio of the perimeter of said dielectric area between said central region and said out region and the perimeter of said central region is approximately 2:1.

8. The proximity sensing device as claimed in claim 6, wherein said central region and said outer region of said planar capacitor are a central conductor area and an outside conductor area substantially in the same plane.

9. A proximity sensing device comprising:
a planar capacitor, the capacitance value of which is substantially unaffected by the presence of a proximity body adjacent said planar capacitor;
drive signal means in circuit connection with said planar capacitor for providing a plurality of drive signal pulses said planar capacitor;
means for forming spiked output pulses in response to respective ones of said plurality of drive signal pulses, said planar capacitor forming part of said means for forming spiked output pulses; and
amplitude comparator means in circuit connection with said means for forming spiked output pulses for receiving said spiked output pulses, said amplitude comparator means comparing the amplitude of a first spiked output pulse referenced as indicating the absence of said proximity body with the amplitude of a subsequent spiked output pulse and providing a proximity output signal when a reduction in the amplitude of said subsequent spiked output pulse as compared to said first spiked output pulse is determined, said proximity output signal providing an indication of said proximity body located adjacent said planar capacitor.

10. A sensing device comprising:
a plurality of proximity sensors organized as a keyboard, each sensor comprising a planar capacitor, the capacitance value of which is substantially unaffected by the presence of a proximity body adjacent said proximity sensor, and means for forming a spiked output pulse in circuit connection with said planar capacitor;
drive signal means for providing a plurality of drive signals to each of said proximity sensors;
amplitude comparator means for receiving said spiked output pulse from a selected one of said plurality of proximity sensors and repeatedly comparing the amplitude of said spiked output pulse with a reference datum, the amplitude of said spiked output pulse being influenced by said proximity body located adjacent said proximity sensor, said amplitude comparator means providing a proximity sensing output signal when the amplitude of said spiked output pulse is reduced as compared with said reference datum, said proximity sensing output signal thereby providing an indication of whether said proximity body is located adjacent said sensor; and
switch means operably connected to said drive signal means and to each of said proximity sensors for selectively connecting said amplitude comparator means with each of said plurality of proximity sensors, such that each proximity sensor is connected to said amplitude comparator means one at a time and before a respective drive signal pulse is applied to said selected one of said plurality of proximity sensors.

* * * * *